(12) United States Patent
Khlat et al.

(10) Patent No.: US 10,931,245 B2
(45) Date of Patent: Feb. 23, 2021

(54) RADIO FREQUENCY AMPLIFIER CIRCUITRY

(71) Applicant: Qorvo US, Inc., Greensboro, NC (US)

(72) Inventors: Nadim Khlat, Cugnaux (FR); Michael R. Kay, Summerfield, NC (US)

(73) Assignee: Qorvo US, Inc., Greensboro, NC (US)

( * ) Notice: Subject to any disclaimer, the term of this patent is extended or adjusted under 35 U.S.C. 154(b) by 0 days.

(21) Appl. No.: 16/582,421

(22) Filed: Sep. 25, 2019

(65) Prior Publication Data
US 2020/0153394 A1 May 14, 2020

Related U.S. Application Data

(60) Provisional application No. 62/759,980, filed on Nov. 12, 2018.

(51) Int. Cl.
- *H03F 1/30* (2006.01)
- *H03F 3/189* (2006.01)
- *H03F 1/02* (2006.01)
- *H03F 3/20* (2006.01)

(52) U.S. Cl.
CPC ............ *H03F 3/189* (2013.01); *H03F 1/0205* (2013.01); *H03F 3/20* (2013.01)

(58) Field of Classification Search
CPC ........................................................ H03F 1/30
USPC .......................................... 330/297, 296, 285
See application file for complete search history.

(56) References Cited

U.S. PATENT DOCUMENTS 9,225,292 B2 * 12/2015 Wimpenny ........... H03F 1/0233

* cited by examiner

*Primary Examiner* — Henry Choe
(74) *Attorney, Agent, or Firm* — Withrow & Terranova, P.L.L.C.

(57) ABSTRACT

Radio frequency (RF) amplifier circuitry for amplifying an RF input signal to provide an RF output signal includes target envelope supply voltage compensation circuitry, envelope tracking power supply circuitry, and power amplifier circuitry. The target envelope supply voltage compensation circuitry is configured to compensate a target envelope supply voltage to provide a compensated target envelope supply voltage, which is used by the envelope tracking power supply circuitry to provide an output envelope supply voltage. The power amplifier circuitry is configured to amplify the RF input signal using a power amplifier envelope supply voltage. The power amplifier envelope supply voltage is different from the output envelope supply voltage due to a parasitic impedance. The target envelope supply voltage compensation circuitry is configured to compensate the target envelope supply voltage to reduce an error between the target envelope supply voltage and the power amplifier envelope supply voltage.

16 Claims, 5 Drawing Sheets

RADIO FREQUENCY AMPLIFIER CIRCUITRY

RELATED APPLICATIONS

This application claims the benefit of provisional patent application Ser. No. 62/759,980, filed Nov. 12, 2018, the disclosure of which is hereby incorporated herein by reference in its entirety.

FIELD OF THE DISCLOSURE

The present disclosure is related to systems and methods for providing an envelope supply voltage for a power amplifier.

BACKGROUND

Figure 1:
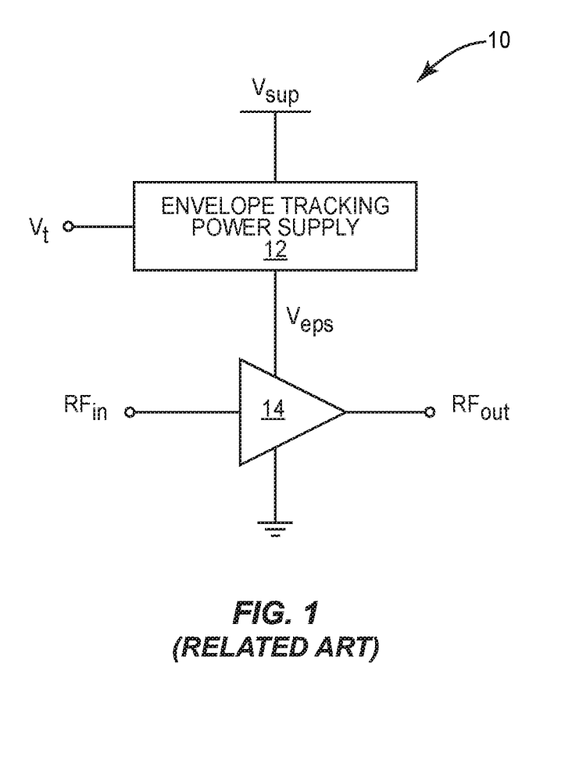
FIG. 1 is a schematic representation of conventional radio frequency (RF) amplifier circuitry.

FIG. 1 shows conventional radio frequency (RF) amplifier circuitry 10. The conventional RF amplifier circuitry 10 includes envelope tracking power supply circuitry 12 coupled to power amplifier circuitry 14. The envelope tracking power supply circuitry 12 is configured to modulate a supply voltage $V_{sup}$ based on a target envelope supply voltage $V_t$ to provide an envelope supply voltage $V_{eps}$, which is stepped up to a higher voltage with respect to the target envelope supply voltage $V_t$. The target envelope supply voltage $V_t$ indicates a desired voltage level of the envelope supply voltage $V_{eps}$ such that the envelope supply voltage $V_{eps}$ tracks an envelope of an RF input signal $RF_{in}$ being amplified by the power amplifier circuitry 14. The target envelope supply voltage $V_t$ may be provided, for example, from transceiver circuitry (not shown). The envelope tracking power supply circuitry 12 is configured to provide the envelope supply voltage $V_{eps}$ such that a voltage thereof tracks the target envelope supply voltage $V_t$. The power amplifier circuitry 14 is configured to receive and amplify the RF input signal $RF_{in}$ using the envelope supply voltage $V_{eps}$ to provide an RF output signal $RF_{out}$. Using the envelope supply voltage $V_{eps}$ to amplify the RF input signal $RF_{in}$ rather than a constant supply voltage significantly increases the efficiency of the RF amplifier circuitry 10.

Figure 2:
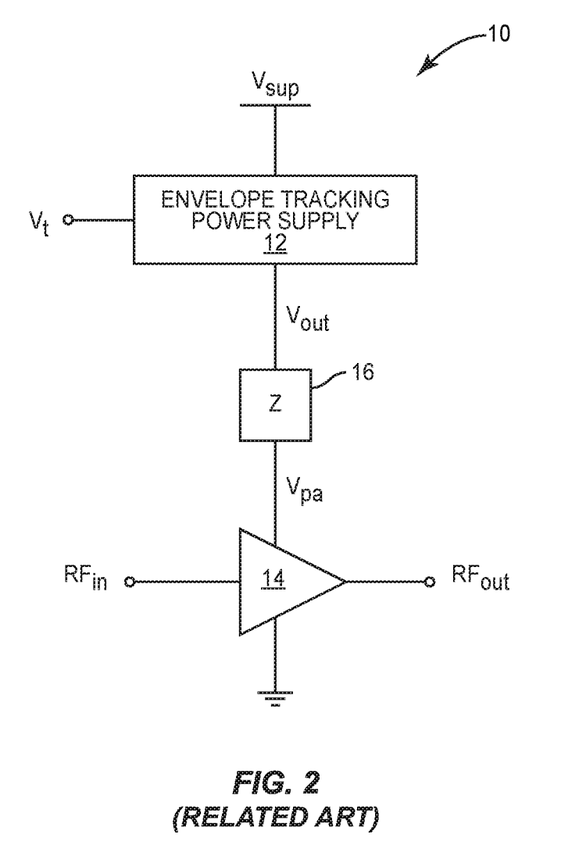
FIG. 2 is a schematic representation of conventional RF amplifier circuitry.

Notably, the envelope tracking power supply circuitry 12 is often provided as a separate die from the power amplifier circuitry 14. Accordingly, the envelope tracking power supply circuitry 12 is often coupled to the power amplifier circuitry 14 via traces on a printed circuit board. The connection between the envelope tracking power supply circuitry 12 and the power amplifier circuitry 14 is thus associated with a parasitic impedance 16 as illustrated in FIG. 2. Due to the parasitic impedance 16 located between the envelope tracking power supply circuitry 12 and the power amplifier circuitry 14, there is a difference between an envelope supply voltage at an output of the envelope tracking power supply circuitry 12, referred to as an output envelope supply voltage $V_{out}$, and an envelope supply voltage at an input of the power amplifier circuitry 14, referred to as a power amplifier envelope supply voltage $V_{pa}$. While the output envelope supply voltage $V_{out}$ may closely track the target envelope supply voltage $V_t$, the power amplifier envelope supply voltage $V_{pa}$ may have a significant error with respect to the target envelope supply voltage $V_t$ due to the parasitic impedance 16 between the envelope tracking power supply circuitry 12 and the power amplifier circuitry 14. The error between the power amplifier envelope supply voltage $V_{pa}$ and the target envelope supply voltage $V_t$ may result in reduced efficiency and increased distortion in the RF output signal $RF_{out}$.

Conventional approaches to remedying the above identified problem have focused on minimizing the distance between the envelope tracking power supply circuitry 12 and the power amplifier circuitry 14, or on integrating one or more parts of the envelope tracking power supply circuitry 12 and the power amplifier circuitry 14 on a single die. Using this approach, the parasitic impedance 16 may be reduced. However, this approach is inflexible, impractical in many situations, and may drive up cost.

In light of the above, there is a need for improved RF amplifier circuitry, and in particular for improved systems and methods for providing an envelope tracking power supply voltage to power amplifier circuitry.

SUMMARY

Radio frequency (RF) amplifier circuitry for amplifying an RF input signal to provide an RF output signal includes target envelope supply voltage compensation circuitry, envelope tracking power supply circuitry, and power amplifier circuitry. The target envelope supply voltage compensation circuitry is coupled to the envelope tracking power supply circuitry. The envelope tracking power supply circuitry is coupled to the power amplifier circuitry. The target envelope supply voltage compensation circuitry is configured to compensate a target envelope supply voltage to provide a compensated target envelope supply voltage. The envelope tracking power supply circuitry is configured to provide an output envelope supply voltage based on the compensated target envelope supply voltage. The power amplifier circuitry is configured to amplify the RF input signal using a power amplifier envelope supply voltage to provide the RF output signal. The power amplifier envelope supply voltage is different from the output envelope supply voltage due to a parasitic impedance between the envelope tracking power supply circuitry and the power amplifier circuitry. The target envelope supply voltage compensation circuitry is configured to compensate the target envelope supply voltage to reduce an error between the target envelope supply voltage and the power amplifier envelope supply voltage. Using the target envelope supply voltage compensation circuitry allows the power amplifier envelope supply voltage, which is an envelope supply voltage at an input of the power amplifier circuitry, to accurately track an envelope of the RF input signal. Accordingly, the performance of the RF amplifier circuitry is improved.

Those skilled in the art will appreciate the scope of the present disclosure and realize additional aspects thereof after reading the following detailed description of the preferred embodiments in association with the accompanying drawing figures.

BRIEF DESCRIPTION OF THE DRAWING FIGURES

The accompanying drawing figures incorporated in and forming a part of this specification illustrate several aspects of the disclosure, and together with the description serve to explain the principles of the disclosure.

DETAILED DESCRIPTION

The embodiments set forth below represent the necessary information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present disclosure. As used herein, the term "and/or" includes any and all combinations of one or more of the associated listed items.

It will be understood that when an element such as a layer, region, or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. Likewise, it will be understood that when an element such as a layer, region, or substrate is referred to as being "over" or extending "over" another element, it can be directly over or extend directly over the other element or intervening elements may also be present. In contrast, when an element is referred to as being "directly over" or extending "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "vertical" may be used herein to describe a relationship of one element, layer, or region to another element, layer, or region as illustrated in the Figures. It will be understood that these terms and those discussed above are intended to encompass different orientations of the device in addition to the orientation depicted in the Figures.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises," "comprising," "includes," and/or "including" when used herein specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms used herein should be interpreted as having a meaning that is consistent with their meaning in the context of this specification and the relevant art and will not be interpreted in an idealized or overly formal sense unless expressly so defined herein.

Figure 3:
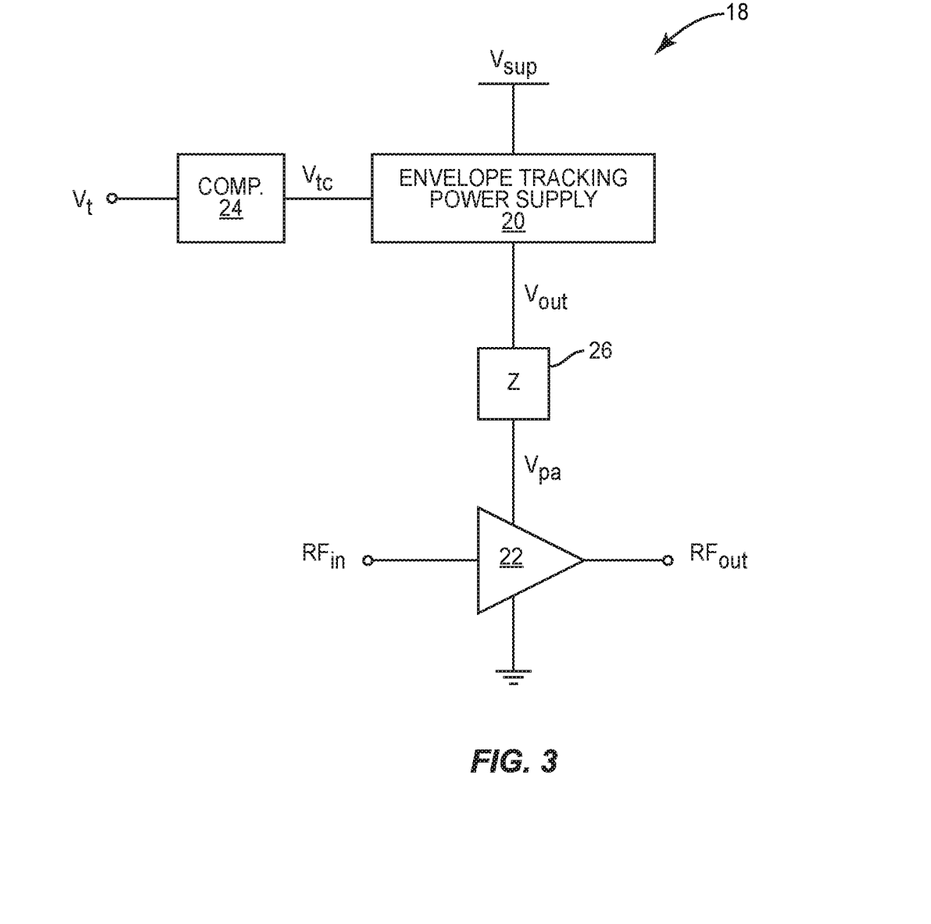
FIG. 3 is a schematic representation of RF amplifier circuitry according to one embodiment of the present disclosure.

FIG. 3 shows radio frequency (RF) amplifier circuitry 18 according to one embodiment of the present disclosure. The RF amplifier circuitry 18 includes envelope tracking power supply circuitry 20, power amplifier circuitry 22, and target envelope supply voltage compensation circuitry 24. The envelope tracking power supply circuitry 20 is coupled to the power amplifier circuitry 22. The target envelope supply voltage compensation circuitry 24 is coupled to the envelope tracking power supply circuitry 20. The target envelope supply voltage compensation circuitry 24 is configured to receive a target envelope supply voltage $V_t$ and compensate the target envelope supply voltage $V_t$ to generate a compensated target envelope supply voltage $V_{tc}$ as discussed in detail below. The target envelope supply voltage $V_t$ indicates a desired voltage level of an envelope supply voltage such that an envelope supply voltage provided from the envelope tracking power supply circuitry 20 tracks an envelope of an RF input signal $RF_{in}$ being amplified by the power amplifier circuitry 22. The target envelope supply voltage $V_t$ may be provided, for example, from transceiver circuitry (not shown). The envelope tracking power supply circuitry 20 is configured to modulate a supply voltage $V_{sup}$ based on the compensated target envelope supply voltage $V_{tc}$ to provide an output envelope supply voltage $V_{out}$. Specifically, the envelope tracking power supply circuitry 20 is configured to provide the output envelope supply voltage $V_{out}$ such that a voltage thereof tracks the compensated target envelope supply voltage $V_{tc}$, which is stepped up with respect to the compensated target envelope supply voltage $V_{tc}$.

As discussed above, there is a parasitic impedance 26 associated with a connection between the envelope tracking power supply circuitry 20 and the power amplifier circuitry 22. Accordingly, there is a difference between the output envelope supply voltage $V_{out}$ and a power amplifier envelope supply voltage $V_{pa}$ such that in conventional RF amplifier circuitry the power amplifier envelope supply voltage $V_{pa}$ has a significant error with respect to the target envelope supply voltage $V_t$. The power amplifier circuitry 22 is configured to receive and amplify the RF input signal $RF_{in}$ using the power amplifier envelope supply voltage $V_{pa}$ to provide an RF output signal $RF_{out}$. Amplifying the RF input signal $RF_{in}$ using the power amplifier envelope supply voltage $V_{pa}$ may include modulating the power amplifier envelope supply voltage $V_{pa}$ based on the RF input signal $RF_{in}$.

Mismatches in the voltage of the power amplifier envelope supply voltage $V_{pa}$ and the target envelope supply voltage $V_t$ may result in poor performance of the RF amplifier circuitry 18. Accordingly, the target envelope supply voltage compensation circuitry 24 is configured to compensate the target envelope supply voltage $V_t$ and provide the compensated target envelope supply voltage $V_{tc}$ such that the power amplifier envelope supply voltage $V_{pa}$ tracks the target envelope supply voltage $V_t$. That is, the output envelope supply voltage $V_{out}$ tracks the compensated target envelope supply voltage $V_{tc}$, and the power amplifier envelope supply voltage $V_{pa}$ tracks the target envelope supply voltage $V_t$. Accordingly, the target envelope supply voltage compensation circuitry 24 compensates for differences between the output envelope supply voltage $V_{out}$ and the power amplifier envelope supply voltage $V_{pa}$ due to the parasitic impedance 26 of the connection between the envelope tracking power supply circuitry 20 and the power amplifier circuitry 22. This allows for accurate envelope tracking of the power amplifier envelope supply voltage $V_{pa}$ and thus improved performance of the RF amplifier circuitry 18.

In one embodiment, the target envelope supply voltage compensation circuitry 24 is configured to perform equalization on the target envelope supply voltage $V_t$ to generate the compensated target envelope supply voltage $V_{tc}$. Details regarding the equalization performed by the target envelope supply voltage compensation circuitry 24 are discussed below. The target envelope supply voltage compensation circuitry 24 may be collocated with the envelope tracking power supply circuitry 20 on the same die, or may be separate from the envelope tracking power supply circuitry 20. Further, the target envelope supply voltage compensation circuitry 24 may be part of transceiver circuitry (not shown) used to provide the target envelope supply voltage $V_t$. The target envelope supply voltage compensation circuitry 24 may be provided as analog circuitry, digital circuitry, or a combination thereof.

As discussed above, previous approaches to improving the performance of RF amplifier circuitry have focused on minimizing the parasitic impedance 26 by reducing the distance between the envelope tracking power supply circuitry 20 and the power amplifier circuitry 22 and/or by integrating one or more parts of the envelope tracking power supply circuitry 20 and the power amplifier circuitry 22 on a single die. However, such an approach is inflexible, not always practical, and may drive up cost. In the course of inventing the subject matter of the present disclosure, the inventors discovered that the effect of the parasitic impedance 26 could be compensated for without reducing the magnitude thereof using the target envelope supply voltage compensation circuitry 24 as discussed below.

Figure 4:
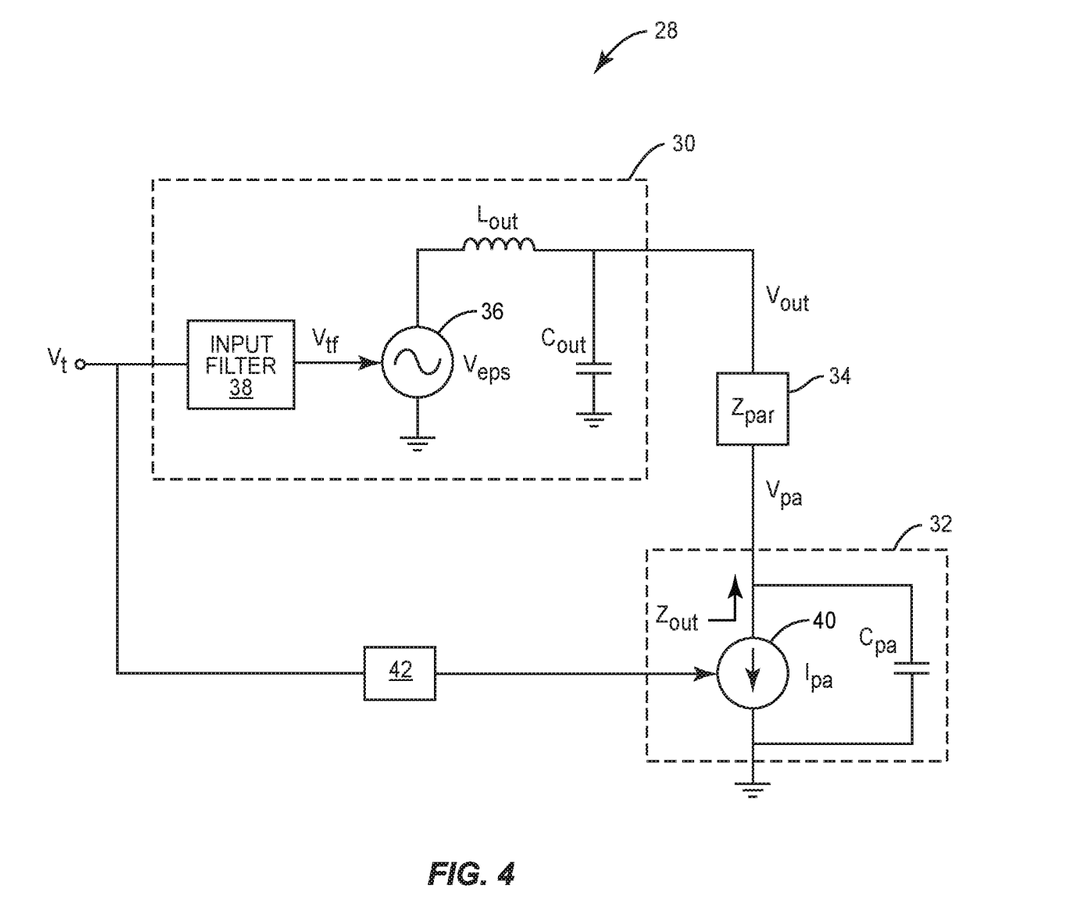
FIG. 4 is a schematic representation of a simplified equivalent circuit for RF amplifier circuitry according to one embodiment of the present disclosure.

FIG. 4 shows a simplified equivalent circuit 28 for RF amplifier circuitry according to one embodiment of the present disclosure. The simplified equivalent circuit 28 includes envelope tracking power supply circuitry 30 coupled to power amplifier circuitry 32 via a parasitic impedance 34. The envelope tracking power supply circuitry 30 includes an ideal voltage source 36 configured to generate an envelope supply voltage $V_{eps}$ based on a target envelope supply voltage $V_t$, which is filtered via input filtering circuitry 38. The envelope supply voltage $V_{eps}$ tracks the target envelope supply voltage $V_t$, but may be stepped up to a higher voltage level than the target envelope supply voltage $V_t$. The envelope supply voltage $V_{eps}$ is provided as an output envelope supply voltage $V_{out}$ via an output series inductance $L_{out}$ and an output parallel capacitance $C_{out}$. The ideal voltage source 36 represents a parallel amplifier in the envelope tracking power supply circuitry 30. The output series inductance $L_{out}$ and the output parallel capacitance $C_{out}$ represent an output impedance of the parallel amplifier in the envelope tracking power supply circuitry 30.

The power amplifier circuitry 32 is modeled as an ideal current source 40, which is configured to provide a power amplifier current $I_{pa}$, coupled in parallel with a power amplifier capacitance $C_{pa}$. Notably, a power amplifier envelope supply voltage $V_{pa}$ is dependent on both the target envelope supply voltage $V_t$ and the power amplifier current $I_{pa}$. Due to this dual dependence of the power amplifier envelope supply voltage $V_{pa}$, it has long been thought that equalization to correct for the effect of the parasitic impedance 34 on the power amplifier envelope supply voltage $V_{pa}$ would be too complicated to practically implement. However, in the course of inventing the subject matter of the present disclosure the inventors discovered that the relationship between the power amplifier envelope supply voltage $V_{pa}$ and the target envelope supply voltage $V_t$ can be expressed as a single input transfer function, thereby allowing for equalization of the target envelope supply voltage $V_t$ with relatively simple equalization circuitry to compensate for the effect of the parasitic impedance 34 on the power amplifier envelope supply voltage $V_{pa}$.

Specifically, the inventors of the subject matter of the present disclosure discovered that the power amplifier current $I_{pa}$ can be expressed as a function of the target envelope supply voltage $V_t$. Accordingly, FIG. 4 shows a dependence between the target envelope supply voltage $V_t$ and the power amplifier current $I_{pa}$ as a transfer function 42 located between an input to the envelope tracking power supply circuitry 30 and the ideal current source 40. The dependence of the power amplifier current $I_{pa}$ on the target envelope supply voltage $V_t$ allows for equalization of the target envelope supply voltage $V_t$ with relatively simple equalization circuitry to compensate for the effect of the parasitic impedance 34 on the power amplifier envelope supply voltage $V_{pa}$.

Specifically, a relationship between the target envelope supply voltage $V_t$ and the power amplifier current $I_{pa}$ can be expressed as $$I_{pa} = \frac{V_t}{R_{pa}}$$

where $R_{pa}$ is an equivalent resistance of the power amplifier circuitry 32 and can be approximated via simulation. With this relationship in mind, the relationship between the target envelope supply voltage $V_t$ and the power amplifier envelope supply voltage $V_{pa}$ can be approximated by Equation (1):

$$TF_{wI_{pa}}(w) = TF_{noI_{pa}}(w) - \frac{Z_{out}(w)}{R_{pa} * e(-j * \text{delay}(f) * w)} \quad (1)$$

where $TF_{wI_{pa}}$ is a transfer function between the target envelope supply voltage $V_t$ and the power amplifier envelope supply voltage $V_{pa}$ when the power amplifier current $I_{pa}$ is present (where the power amplifier current $I_{pa}$ is approximated by the relationship $$I_{pa} = \frac{V_t}{R_{pa}}),$$

$TF_{noI_{pa}}$ is the transfer function between the target envelope supply voltage $V_t$ and the power amplifier envelope supply voltage $V_{pa}$ when no power amplifier current $I_{pa}$ is present, $Z_{out}$ is an output impedance of the equivalent circuit 28 looking back from the power amplifier circuitry 32 towards the envelope tracking power supply circuitry 30, and delay (*f*) is an estimated delay at a given frequency of the expected transfer function when the ideal current source 40 is replaced with a resistor equal to a resistance of a load coupled to the simplified equivalent circuit 28.

Turning back to FIG. 3, Equation (1) can be used to generate an equalizer function for equalizing the target envelope supply voltage $V_t$ in order to compensate for the effect of the parasitic impedance 26 on the power amplifier envelope supply voltage $V_{pa}$. The equalizer function may be implemented by the target envelope supply voltage compensation circuitry 24. An exemplary equalizer function is shown in Equation (2):

$$H_{eq} = \frac{1 + 1 * j * \frac{w}{w_{eq0}}}{1 + j * \frac{w}{0_{eq} * w_{0eq}} - \left(\frac{w}{w_{0eq}}\right)^2} \quad (2)$$

where $0_{eq}$ is between 0.2 and 0.7, $w_{eq0}$ is between $100 \times 10^6$ and $200 \times 10^6$, and $w_{0eq}$ is between $100 \times 10^6$ and $200 \times 10^6$. Notably, $0_{eq}$ determines a Q factor, while $w_{eq0}$ and $w_{0eq}$ determine the placement of one or more zeros in the equalization function. In some embodiments, $w_{eq0}$ may be omitted such that only one zero is present in the equalization function. The above equalization function is only exemplary. The target envelope supply voltage compensation circuitry 24 may implement any suitable equalization function in order to compensate for the effect of the parasitic impedance 26 on the power amplifier envelope supply voltage $V_{pa}$ without departing from the principles of the present disclosure.

Figure 5:
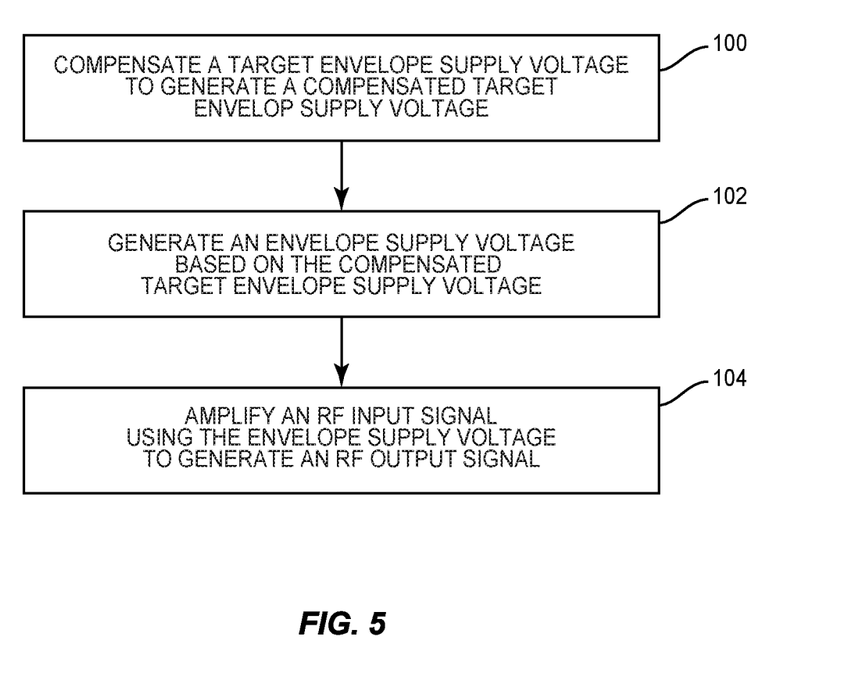
FIG. 5 is a flow diagram illustrating a method for amplifying an RF input signal according to one embodiment of the present disclosure.

FIG. 5 is a flow diagram illustrating a method for amplifying an RF input signal according to one embodiment of the present disclosure. First, a target envelope supply voltage is compensated to generate a compensated target envelope supply voltage (step 100). As discussed above, the target envelope supply voltage indicates a desired voltage for an envelope tracking voltage such that the envelope tracking voltage tracks an envelope of the RF input signal. Further as discussed above, compensating the target envelope supply voltage compensates for changes in the target envelope supply voltage that may occur between an output of envelope tracking power supply circuitry and an input of power amplifier circuitry due to a parasitic impedance associated with a connection between the envelope tracking power supply circuitry and the power amplifier circuitry.

Next, an envelope supply voltage is generated based on the compensated target envelope supply voltage (step 102). Generating the envelope supply voltage may include modulating a supply voltage based on the compensated target envelope supply voltage. Finally, the RF input signal is amplified using the envelope supply voltage to generate an RF output signal (step 104). Amplifying the RF input signal to provide the RF output signal may include modulating the envelope supply voltage based on the RF input signal.

The target envelope supply voltage is compensated for changes in the envelope supply voltage between an output of the envelope tracking power supply circuitry and an input of the power amplifier circuitry due to a parasitic impedance between the two. Accordingly, the envelope supply voltage received at the power amplifier circuitry accurately tracks the envelope of the RF input signal. The performance of RF amplifier circuitry is therefore improved when using the method discussed herein.

Those skilled in the art will recognize improvements and modifications to the preferred embodiments of the present disclosure. All such improvements and modifications are considered within the scope of the concepts disclosed herein and the claims that follow.

What is claimed is:

1. Radio frequency (RF) amplifier circuitry for amplifying an RF input signal to provide an RF output signal, the RF amplifier circuitry comprising:
    target envelope supply voltage compensation circuitry configured to compensate a target envelope supply voltage to provide a compensated target envelope supply voltage;
    envelope tracking power supply circuitry coupled to the target envelope supply voltage compensation circuitry, the envelope tracking power supply circuitry configured to provide an output envelope supply voltage based on the compensated target envelope supply voltage; and
    power amplifier circuitry coupled to the envelope tracking power supply circuitry, the power amplifier circuitry configured to amplify the RF input signal using a power amplifier envelope supply voltage to provide the RF output signal, wherein:
        the power amplifier envelope supply voltage is different from the output envelope supply voltage due to a parasitic impedance between the envelope tracking power supply circuitry and the power amplifier circuitry; and
        the target envelope supply voltage compensation circuitry is configured to compensate the target envelope supply voltage to reduce an error between the target envelope supply voltage and the power amplifier envelope supply voltage.

2. The RF amplifier circuitry of claim 1 wherein the target envelope supply voltage indicates a voltage level of an envelope of the RF input signal.

3. The RF amplifier circuitry of claim 2 wherein the target envelope supply voltage compensation circuitry is located on the same die as the envelope tracking power supply circuitry.

4. The RF amplifier circuitry of claim 2 wherein the envelope tracking power supply circuitry and the power amplifier circuitry are located on different die.

5. The RF amplifier circuitry of claim 2 wherein the target envelope supply voltage compensation circuitry is configured to perform equalization on the target envelope supply voltage to provide the compensated target envelope supply voltage.

6. The RF amplifier circuitry of claim 1 wherein the target envelope supply voltage compensation circuitry is located on the same die as the envelope tracking power supply circuitry.

7. The RF amplifier circuitry of claim 1 wherein the envelope tracking power supply circuitry and the power amplifier circuitry are located on different die.

8. The RF amplifier circuitry of claim 1 wherein the target envelope supply voltage compensation circuitry is configured to perform equalization on the target envelope supply voltage to provide the compensated target envelope supply voltage.

9. The RF amplifier circuitry of claim 1 wherein providing the output envelope power supply voltage based on the compensated target envelope supply voltage comprises modulating a supply voltage based on the compensated target envelope supply voltage.

10. The RF amplifier circuitry of claim 1 wherein amplifying the RF input signal using the power amplifier envelope supply voltage comprises modulating the power amplifier envelope supply voltage based on the RF input signal.

11. A method for amplifying a radio frequency (RF) input signal to provide an RF output signal, the method comprising:
    compensating a target envelope supply voltage to provide a compensated target envelope supply voltage;
    providing an output envelope supply voltage based on the compensated target envelope supply voltage; and
    amplifying the RF input signal using a power amplifier envelope supply voltage to provide the RF output signal, wherein:
        the power amplifier envelope supply voltage is different from the output envelope supply voltage due to a parasitic impedance between envelope tracking power supply circuitry and power amplifier circuitry; and
        compensating the target envelope supply voltage comprises compensating the target envelope supply voltage to reduce an error between the target envelope supply voltage and the power amplifier envelope supply voltage.

12. The method of claim 11 wherein the target envelope supply voltage indicates a voltage level of an envelope of the RF input signal.

13. The method of claim 12 wherein compensating the target envelope supply voltage comprises performing equalization on the target envelope supply voltage.

14. The method of claim 11 wherein compensating the target envelope supply voltage comprises performing equalization on the target envelope supply voltage.

15. The method of claim 11 wherein providing the output envelope supply voltage based on the compensated target envelope supply voltage comprises modulating a supply voltage based on the compensated target envelope supply voltage.

16. The method of claim 11 wherein amplifying the RF input signal using the power amplifier envelope supply voltage comprises modulating the power amplifier envelope supply voltage based on the RF input signal.

* * * * *